United States Patent
Wu

(10) Patent No.: US 10,068,813 B2
(45) Date of Patent: Sep. 4, 2018

(54) ARRAY SUBSTRATE, LIQUID CRYSTAL DISPLAY PANEL AND BROKEN-LINE REPAIRING METHOD THEREOF

(75) Inventor: Song Wu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 169 days.

(21) Appl. No.: 13/698,871

(22) PCT Filed: Aug. 1, 2012

(86) PCT No.: PCT/CN2012/079529
§ 371 (c)(1),
(2), (4) Date: Nov. 19, 2012

(87) PCT Pub. No.: WO2013/017087
PCT Pub. Date: Feb. 7, 2013

(65) Prior Publication Data
US 2013/0155342 A1    Jun. 20, 2013

(30) Foreign Application Priority Data
Aug. 2, 2011 (CN) .......................... 2011 1 0219983

(51) Int. Cl.
*G02F 1/1343* (2006.01)
*H01L 21/66* (2006.01)
(Continued)

(52) U.S. Cl.
CPC ........ *H01L 22/20* (2013.01); *G02F 1/136259* (2013.01); *H01L 27/156* (2013.01);
(Continued)

(58) Field of Classification Search
CPC ............... G02F 1/136259; G02F 2001/136263
(Continued)

(56) References Cited

U.S. PATENT DOCUMENTS 5,859,679 A * 1/1999 Song ............................... 349/54
5,995,178 A * 11/1999 Fujikawa et al. ............... 349/55
(Continued)

FOREIGN PATENT DOCUMENTS

CN          2769951 Y     4/2006
CN          1782826 A     6/2006
(Continued)

OTHER PUBLICATIONS

Machine English Translation of Fujikawa et al., KR 10-0283733, Mar. 2001.*
(Continued)

*Primary Examiner* — Jessica M Merlin
*Assistant Examiner* — Mark Teets
(74) *Attorney, Agent, or Firm* — Ladas & Parry LLP

(57) ABSTRACT

According to the present disclosure, there is disclosed an array substrate, a liquid crystal display panel and a broken-line repairing method thereof. The array substrate comprises: signal lines, which includes a plurality of gate lines and a plurality of data lines intersecting with each other; and a plurality of pixel units defined by the gate lines and the data lines, wherein a thin film transistor, a common electrode and a pixel electrode, which is connected to a drain of the thin film transistor, are formed in each of the pixel units, for each of the pixel units, at the positions of two corners which are adjacent to one of the data lines, a first repair area and a second repair area are formed, respectively; within the first repair area and the second repair area, patterns of the pixel electrode and the data line overlap, and there is no pattern of the common electrode.

2 Claims, 9 Drawing Sheets

(51) Int. Cl.
*G02F 1/1362* (2006.01)
*H01L 27/15* (2006.01)

(52) U.S. Cl.
CPC ............ *G02F 2001/136263* (2013.01); *G02F 2201/122* (2013.01); *H01L 2924/0002* (2013.01)

(58) Field of Classification Search
USPC .......................................... 349/54, 55, 192
See application file for complete search history.

(56) References Cited

U.S. PATENT DOCUMENTS

| | | | |
|---|---|---|---|
| 6,839,096 | B1 | 1/2005 | Jeong et al. |
| 7,119,872 | B2 * | 10/2006 | Choi ............................. 349/192 |
| 7,187,423 | B2 * | 3/2007 | Ozaki et al. .................. 349/192 |
| 7,532,302 | B2 * | 5/2009 | Li ..................... G09G 3/3648 349/192 |
| 7,649,580 | B2 * | 1/2010 | Su ..................... G02F 1/136259 349/192 |
| 2005/0078234 | A1 | 4/2005 | Jeong et al. |
| 2005/0285989 | A1 | 12/2005 | Sakurai et al. |
| 2006/0109409 | A1 * | 5/2006 | Lai ................................ 349/139 |
| 2009/0284680 | A1 * | 11/2009 | Peng ............................. 349/55 |
| 2009/0322978 | A1 * | 12/2009 | Peng ................. G02F 1/136259 349/54 |
| 2010/0225870 | A1 | 9/2010 | Park et al. |

FOREIGN PATENT DOCUMENTS

| | | |
|---|---|---|
| CN | 101430438 A | 5/2009 |
| CN | 101581840 A | 11/2009 |
| CN | 101614916 A | 12/2009 |
| JP | 0980470 A | 3/1997 |
| JP | 09127549 A | 5/1997 |
| JP | 11138449 A | 5/1999 |
| JP | 2004-264726 A | 9/2004 |
| JP | 2006-011162 A | 1/2006 |
| KR | 1100283733 A | 12/2000 |
| KR | 20030027203 A | 4/2003 |

OTHER PUBLICATIONS

International Search Report dated Nov. 1, 2012; PCT/CN2012/079529.
First Chinese Office Action dated Dec. 27, 2013; Appln. No. 201110219983.4
Second Chinese Office Action dated Feb. 13, 2014; Appln. No. 201110219983.4.
Korea Office Action dated Jan. 19, 2014; Appln. No. 10-2012-7029772.
International Preliminary Report on Patentability dated Feb. 4, 2014; PCT/CN2012/079529.
Korean Office Action dated Jul. 31, 2014; Appln. No. 10-2012-7029772.
Japanese Office Action Appln. No. 2014-523187; Dated Nov. 20, 2015.
Extended European Search Report dated Jul. 7, 2016; Appln. No. 16157389.4-1904/3043204.
Japanese Office Action dated Apr. 11, 2016; Appln. No. 2014-523187.
Japanese Office Action dated Sep. 12, 2016 Appln. No. 2014-523187.

* cited by examiner

ARRAY SUBSTRATE, LIQUID CRYSTAL DISPLAY PANEL AND BROKEN-LINE REPAIRING METHOD THEREOF

CROSS REFERENCE TO RELATED APPLICATIONS

This application is a national stage application under 35 U.S.C. 371 and claims the benefit of PCT Application No. PCT/CN2012/079529 having an international filing date of Aug. 1, 2012, which designated the United States, which PCT application claimed the benefit of Chinese Application No. 201110219983.4 filed Aug. 2, 2011, the disclosure of both the above-identified applications are incorporated herein by reference.

FIELD OF THE INVENTION

The present disclosure relates to an array substrate, a liquid crystal display panel comprising the array substrate and a broken-line repairing method thereof.

BACKGROUND

In the course of manufacturing a liquid crystal display panel, repairing broken lines is an important means of enhancing the yield. A structure in which a data repair line is arranged on the periphery of the liquid crystal display panel is usually adopted in the prior art, so as to facilitate the repair of a data-line broken line.

A normal pixel structure on an array substrate of the liquid crystal display panel is shown in FIG. 1, and comprises: gate lines 11 and data lines 12, and pixel units 20 which are defined by the gate lines 11 and the data lines 12; a thin film transistor 13, a common electrode 14 and a pixel electrode 15 being formed in the pixel units 20. If one of the data lines in the liquid crystal display panel is a broken line, the data-line broken line may be repaired with reference to FIG. 2. A specific procedure for the repair is as follows: both ends of the data-line broken line are connected, respectively, to a data repair line 41 by means of laser soldering, so as to achieve an object of repairing the data-line broken line.

However, the above broken-line repairing method may be limited by the number of the data repair line. In general, one data repair line or two data repair lines may be arranged in the liquid crystal display panel for repair of one data-line broken line or two data-line broken lines. If there are too many data-line broken lines in a liquid crystal display panel, the liquid crystal display panel may have to be discarded, to thereby affect the yield of a product.

SUMMARY

According to an embodiment of the present disclosure, there is provided an array substrate, comprising: signal lines, which includes a plurality of gate lines and a plurality of data lines intersecting with each other; and a plurality of pixel units defined by the gate lines and the data lines, wherein a thin film transistor, a common electrode and a pixel electrode which is connected to a drain of the thin film transistor, are formed in each of the pixel units, at the position of two corners in each of the pixel units which are adjacent to one of the data lines, a first repair area and a second repair area are formed, respectively; within the first repair area and the second repair area, patterns of the pixel electrode and the one of the data lines overlap, and there is no pattern of the common electrode.

In the array substrate according to an example, for the pixel unit, at the position of one corner which is adjacent to one of the gate lines connected to the thin film transistor of the pixel unit and is not the place where the thin film transistor is located, a third repair area is further formed; within the third repair area, patterns for the pixel electrode and the gate line overlap, and there is no pattern of the common electrode.

In the array substrate according to another example, a data repair line is formed around a pixel region comprising all of the pixel units; for the pixel unit, at the positions of two corners which are adjacent to another data line, a fourth repair area and a fifth repair area are further formed, respectively; within the fourth repair area and the fifth repair area, patterns for the pixel electrode and the said another data line overlap, and there is no pattern of the common electrode.

According to another embodiment of the present disclosure, there is provided a method for repairing a broken line for the signal lines, comprising: a1, detecting and determining the position of a breakpoint for the signal lines; a2, when the breakpoint of a data line is detected, by means of laser soldering, the pixel electrode in the first repair area on one side of the breakpoint of the data line is connected to the data line, and the pixel electrode in the second repair area on another side of the breakpoint of the data line is connected to the data line; when the breakpoint of a gate line is detected, by means of laser soldering, the pixel electrode in the third repair area on one side of the breakpoint of the gate line is connected to the gate line, and the drain of the thin film transistor on another side of the breakpoint of the gate line is connected to the gate line.

According to still another embodiment of the present disclosure, there is provided a method for repairing a broken line for the signal lines, comprising: c1, detecting and determining the position of a breakpoint for the signal lines; c2, when the breakpoint of a data line is detected, by means of laser soldering, the pixel electrode in the first repair area on one side of the breakpoint of the data line is connected to the data line, and the pixel electrode in the second repair area on another side of the breakpoint of the data line is connected to the data line; alternatively, by means of laser soldering, the pixel electrode in the fourth repair area on one side of the breakpoint of the data line is connected to the data line, and the pixel electrode in the fifth repair area on another side of the breakpoint of the data line is connected to the data line; when the breakpoint of a gate line is detected, by means of laser soldering, a drain of a thin film transistor on one side of the breakpoint of the gate line is connected to the gate line; by means of laser cutting, a data line on another side of the breakpoint of the gate line is cut off at two sides of two repair areas adjacent to the gate line; by means of laser soldering, pixel electrodes in the two repair areas are connected to the data line, respectively, and a drain of a thin film transistor connected to the data line is connected to the gate line; by means of laser soldering, the data line is connected to the data repair line.

DETAILED DESCRIPTION

Thereinafter, the technical solutions in embodiments of the present disclosure will be described in a clearly and fully understandable way in connection with the drawings related to the embodiments of the present disclosure. It is obvious that the described embodiments are just a part but not all of the embodiments of the present disclosure. Based on the described embodiments herein, every other embodiment, which can be obtained by those skilled in the art without any inventive work, should be within the protection scope of the present disclosure.

Embodiment 1

Figure 3:
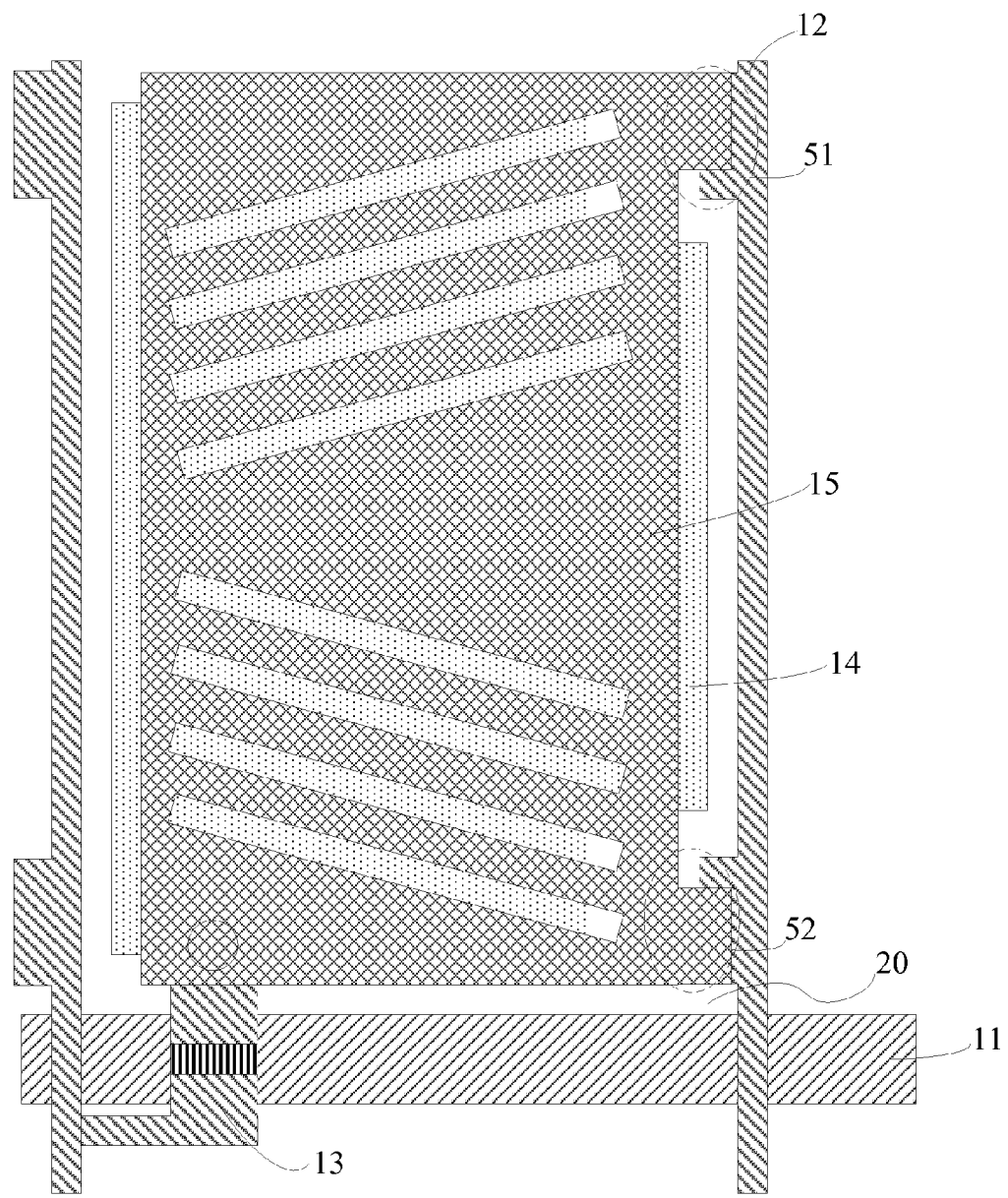
FIG. 3 is a schematic view showing a pixel structure on an array substrate of a liquid crystal display panel, provided by embodiment 1.

In order to enhance the yield of a liquid crystal display panel, an array substrate is provided by an embodiment of the present disclosure. As shown in FIG. 3, the array substrate comprises: a plurality of gate lines 11 and a plurality of data lines 12 intersecting with each other (collectively called as signal lines), and a plurality of pixel units 20 defined by the gate lines 11 and the data lines 12 (only one pixel unit is shown in the figure as an example). A thin film transistor 13, a common electrode 14 and a pixel electrode 15 which is connected to a drain of the thin film transistor 13 are formed in each of the pixel units 20. For the pixel unit 20, at the positions of two corners which are adjacent to one of the data lines 12, a first repair area 51 and a second repair area 52 are formed, respectively. Within the first repair area 51 and the second repair area 52, patterns of the pixel electrode 15 and the data line 12 overlap, and there is no pattern of the common electrode 14.

Preferably, within the first repair area 51 and the second repair area 52, the pixel electrode 15 and the data line 12 each are formed with protruding patterns, and the protruding patterns of the two overlap. That is, the pixel electrode 15 is formed with the protruding patterns protruding toward the data line 12, and the data line is formed with the protruding pattern protruding toward the pixel electrode 15, and the protruding patterns of the pixel electrode 15 and the protruding patterns of the data line 12 overlap.

For example, the thin film transistor within each pixel unit is located at a position adjacent to one corner of the pixel unit. A source of the thin film transistor is connected to a corresponding data line, and a gate of the thin film transistor is connected to a corresponding gate line, as shown in FIG. 3.

It should be noted that, the pixel structure shown in FIG. 3, is described with reference to an example in which at the positions of two corners for the pixel unit 20 which are adjacent to one of data lines 12 on the right, the first repair area 51 and the second repair area 52 are formed. However, the pixel structure shown in FIG. 3 is not the unique case. For example, for the pixel unit 20, a first repair area and a second repair area may be formed at the positions of two corners which are adjacent to one of data lines 12 on the left.

Figure 4:
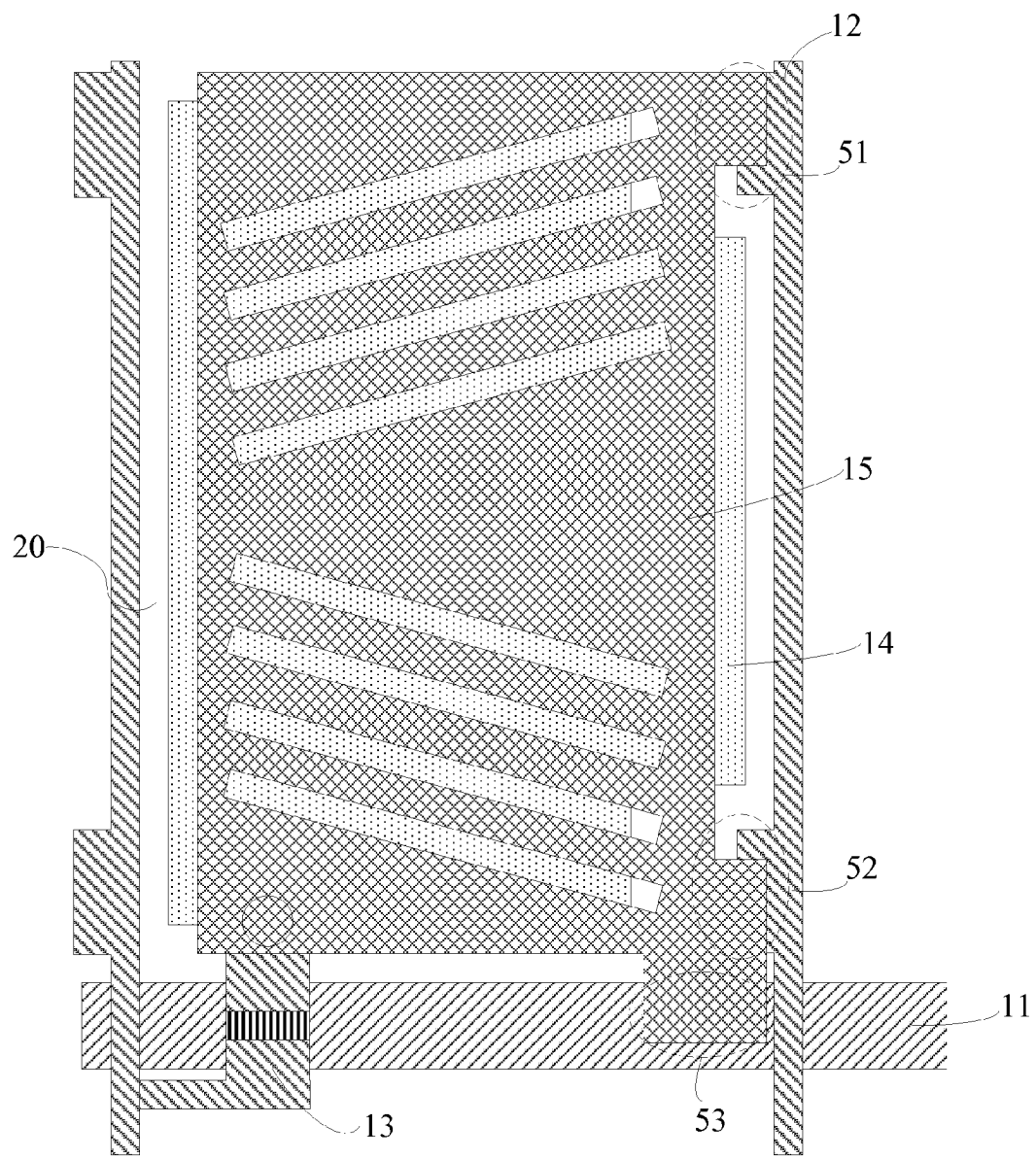
FIG. 4 is a schematic view showing a pixel structure on an array substrate of another type of liquid crystal display panel, provided by embodiment 1.

Further, as shown in FIG. 4, for the pixel unit 20, at the position of one corner which is adjacent to one of gate lines 11 connected to the thin film transistor of the pixel unit 20 and is not the place where the thin film transistor 13 is located, a third repair area 53 is additionally formed. Within the third repair area 53, patterns for the pixel electrode 15 and the gate line 11 overlap, and there is no pattern of the common electrode 14.

Preferably, within the third repair area 53, the pixel electrode 15 is formed with a protruding pattern protruding toward the gate line, and the protruding pattern and the pattern of the gate line overlap.

The array substrate shown in FIG. 3 can only be used to repair a broken line for data lines 12, while an array substrate shown in FIG. 4 can be used to repair not only the broken line for data lines 12, but also a broken line for gate lines 11. Hereinafter, with reference to a liquid crystal display panel formed with the pixel structure shown in FIG. 4, methods for repairing the broken line for data lines 12 and the broken line for gate lines 11 are introduced, respectively. Regarding a method for repairing the broken line for data lines 12 with the array substrate shown in FIG. 3, it can also refer to the methods described below.

Figure 5:
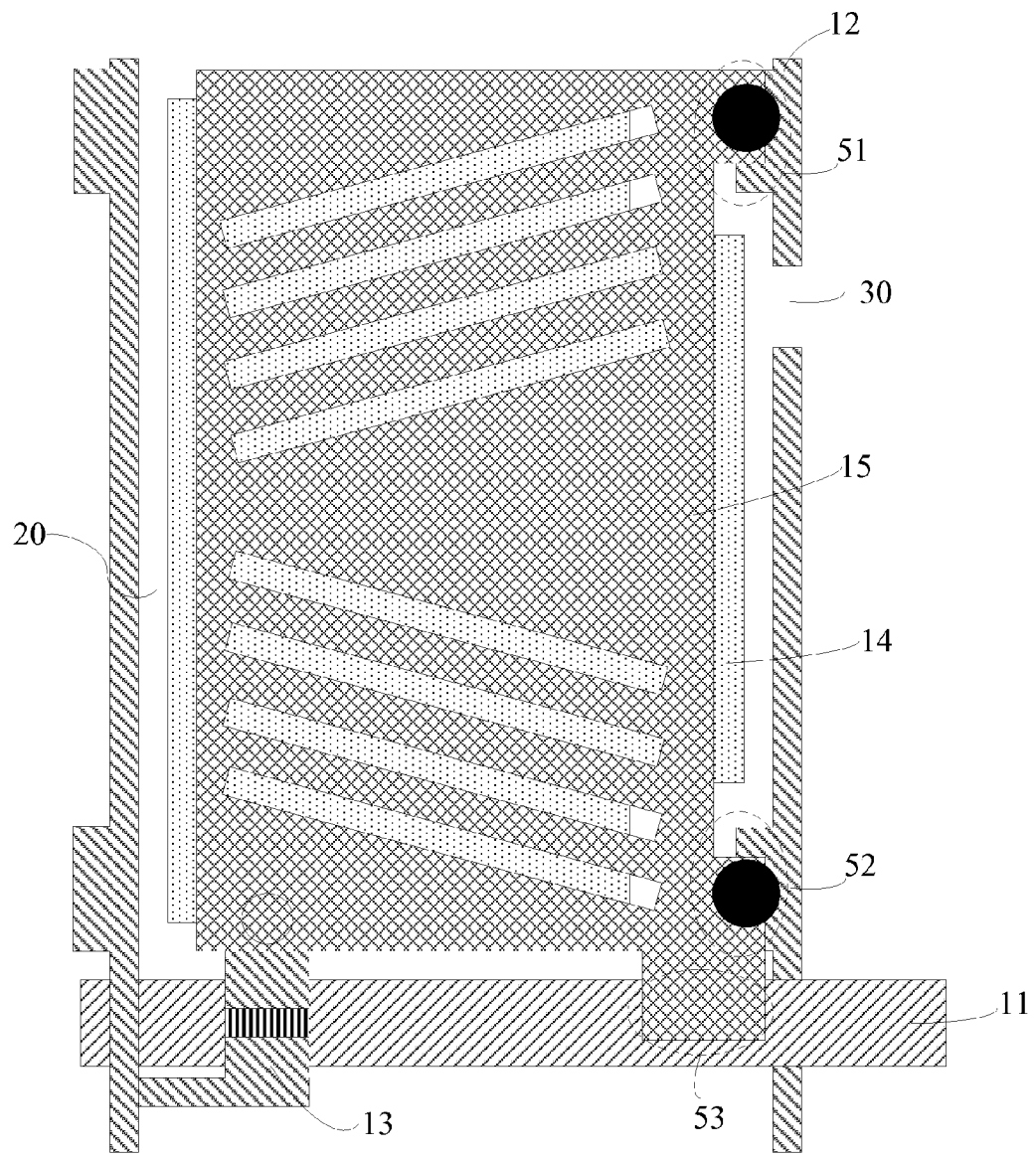
FIG. 5 is a schematic view showing a method for repairing a data-line broken line in an array substrate, which is formed with the pixel structure as shown in FIG. 4.

Firstly, a method for repairing a broken line for data lines 12 in the liquid crystal display panel is explained with reference to FIG. 5, and comprises:

a1, the position of a breakpoint 30 of a data line is detected and determined;

a2, by means of laser soldering, the pixel electrode 15 in the first repair area 51 on one side of the breakpoint 30 of the data line is connected to the data line 12, and the pixel electrode 15 in the second repair area 52 on another side of the breakpoint 30 of the data line is connected to the data line 12.

Wherein, the positions for laser soldering are denoted by black circle dot or black ellipse dot.

By step a2, the data line on top side of the breakpoint 30 of the data line is connected to the pixel electrode 15, and the data line on the lower side the breakpoint 30 of the data line is also connected to the pixel electrode 15, so that the broken line for data lines is repaired with the pixel electrode.

Figure 6:
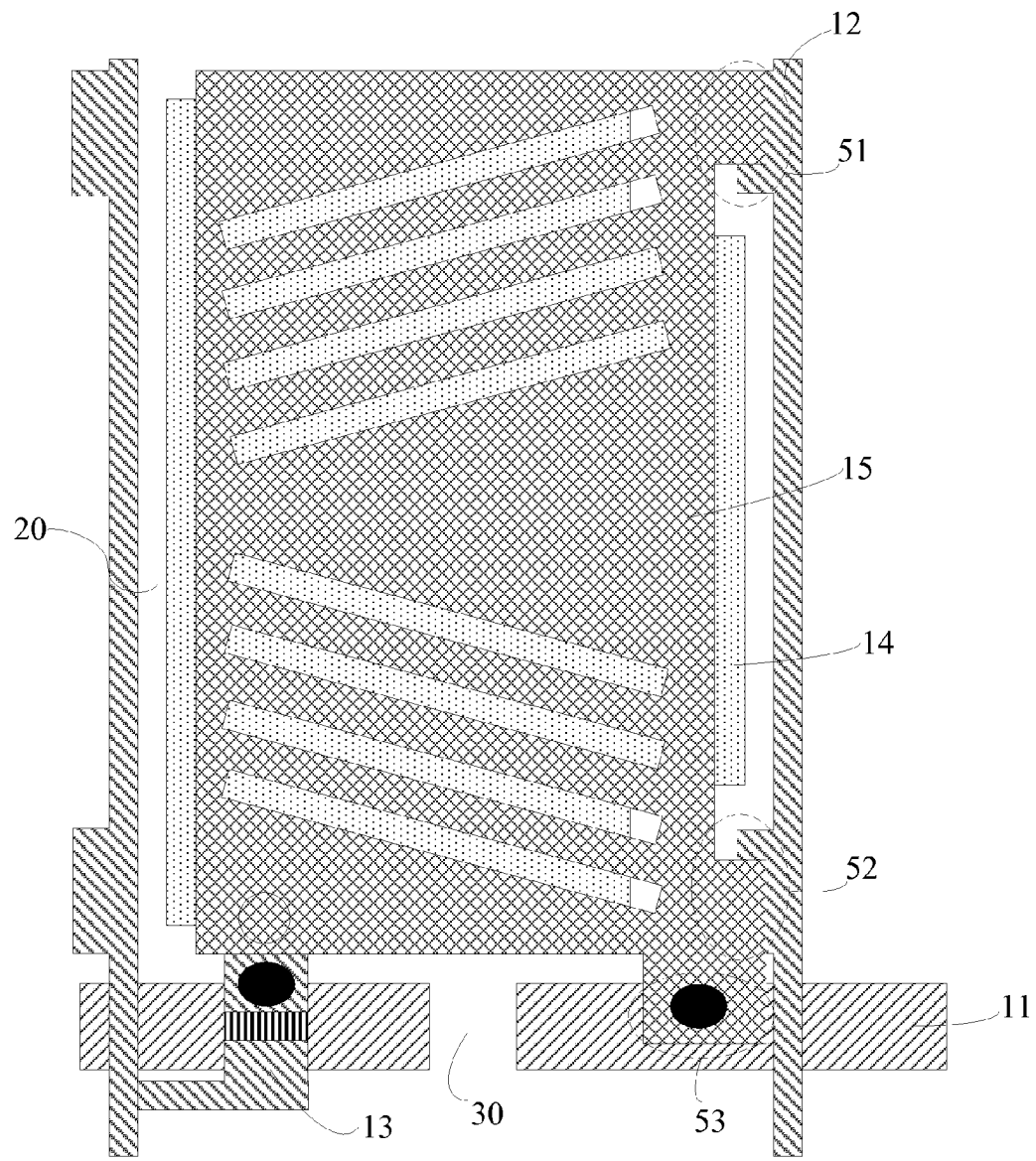
FIG. 6 is a schematic view showing a method for repairing a gate-line broken line in an array substrate, which is formed with the pixel structure as shown in FIG. 4.

In addition, a method for repairing a broken line for gate lines 11 in the liquid crystal display panel is explained with reference to FIG. 6, and comprises:

b1, the position of a breakpoint 30 of a gate line is detected and determined;

b2, by means of laser soldering, the pixel electrode 15 in the third repair area 53 on one side of the breakpoint of the gate line 11 is connected to the gate line 11, and the drain of the thin film transistor 13 on another side of the breakpoint of the gate line 11 is connected to the gate line 11.

By step b2, the gate line on the left side of the breakpoint 30 of the gate line is connected to the drain of the thin film transistor, which is connected to the pixel electrode via a through hole, and the gate line on the right side of the breakpoint 30 of the gate line is also connected to the pixel electrode, so that the broken line for gate lines is repaired with the pixel electrode.

According to the technical solutions provided by the embodiment of the present disclosure, the first repair area and the second repair area can be used to repair a data-line broken line, and further, the third repair area can be used to repair a gate-line broken line. The solutions provided by the present disclosure do not set a limit to the numbers of the data-line broken line and the gate-line broken line, and even if the number of the data-line broken line or the gate-line broken line is larger, they may be repaired one by one, thereby increasing the yield of the liquid crystal display panel.

Embodiment 2

Figure 7:
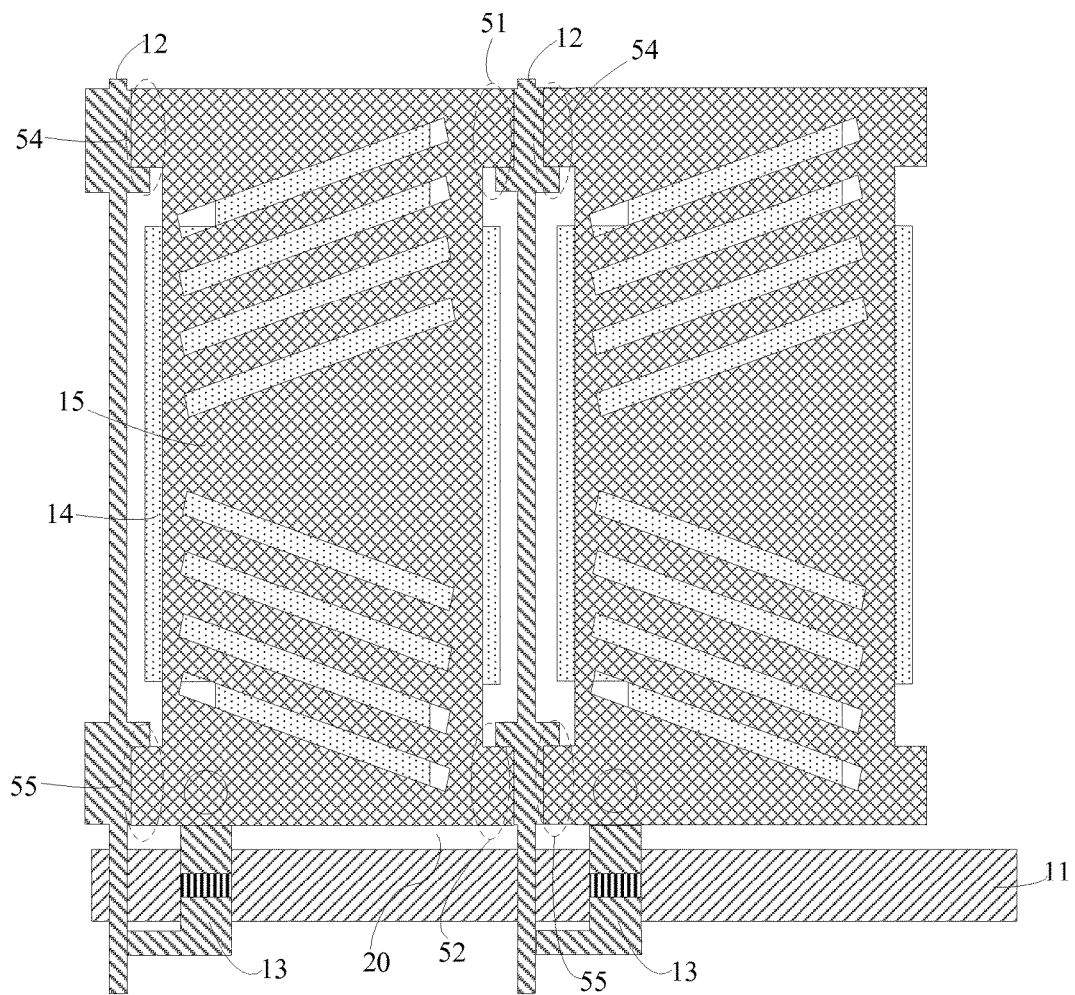
FIG. 7 is a schematic view showing a pixel structure on an array substrate of a liquid crystal display panel, provided by embodiment 2.

Another type of array substrate is provided by an embodiment of the present disclosure. Referring to FIG. 7, the array substrate comprises: a plurality of gate lines 11 and a plurality of data lines 12, and a plurality of pixel units 20 (two pixel units are shown in the figure as an example) defined by the gate lines 11 and the data lines 12. A thin film transistor 13, a common electrode 14 and a pixel electrode 15, which is connected to a drain of the thin film transistor 13, are formed in each of the pixel units 20. For the pixel unit 20, at the positions of two corners which are adjacent to one of the data lines 12, a first repair area 51 and a second repair area 52 are formed, respectively. Within the first repair area 51 and the second repair area 52, patterns of the pixel electrode 15 and the data line 12 overlap, and there is no pattern of the common electrode 14.

Preferably, within the first repair area 51 and the second repair area 52, the pixel electrode 15 and the data line 12 each are formed with protruding patterns, and the protruding patterns of the two overlap. That is, the pixel electrode 15 is formed with the protruding patterns protruding toward the data line 12, and the data line is formed with the protruding patterns protruding toward the pixel electrode 15, and the protruding patterns of the pixel electrode 15 and the protruding patterns of the data line 12 overlap.

Further, a data repair line 41 is formed in the liquid crystal display panel. The wiring of the data repair line 41 can refer to FIG. 2, and is not different from the wiring in the prior art. The data repair line can be formed around a pixel region comprising all the pixel units.

Referring to FIG. 7, for the pixel unit 20, at the positions of two corners which are adjacent to another data line 12, a fourth repair area 54 and a fifth repair area 55 are additionally formed. Within the fourth repair area 54 and the fifth repair area 55, patterns for the pixel electrode 15 and the said another data line 12 overlap, and there is no pattern of the common electrode 14.

Preferably, within the fourth repair area 54 and the fifth repair area 55, the pixel electrode 15 and the said another data line 12 each are formed with protruding patterns, and the protruding patterns of the two overlap. That is, the pixel electrode 15 is formed with the protruding patterns protruding toward the said another data line 12, and the said another data line is formed with the protruding patterns protruding toward the pixel electrode 15, and the protruding patterns of the pixel electrode 15 and the protruding patterns of the said another data line 12 overlap.

In the pixel structure shown in FIG. 7, the said one of data lines 12 is a data line on the right of the pixel unit 20, and the said another data line 12 is a data line on the left of the pixel unit 20.

Figure 8:
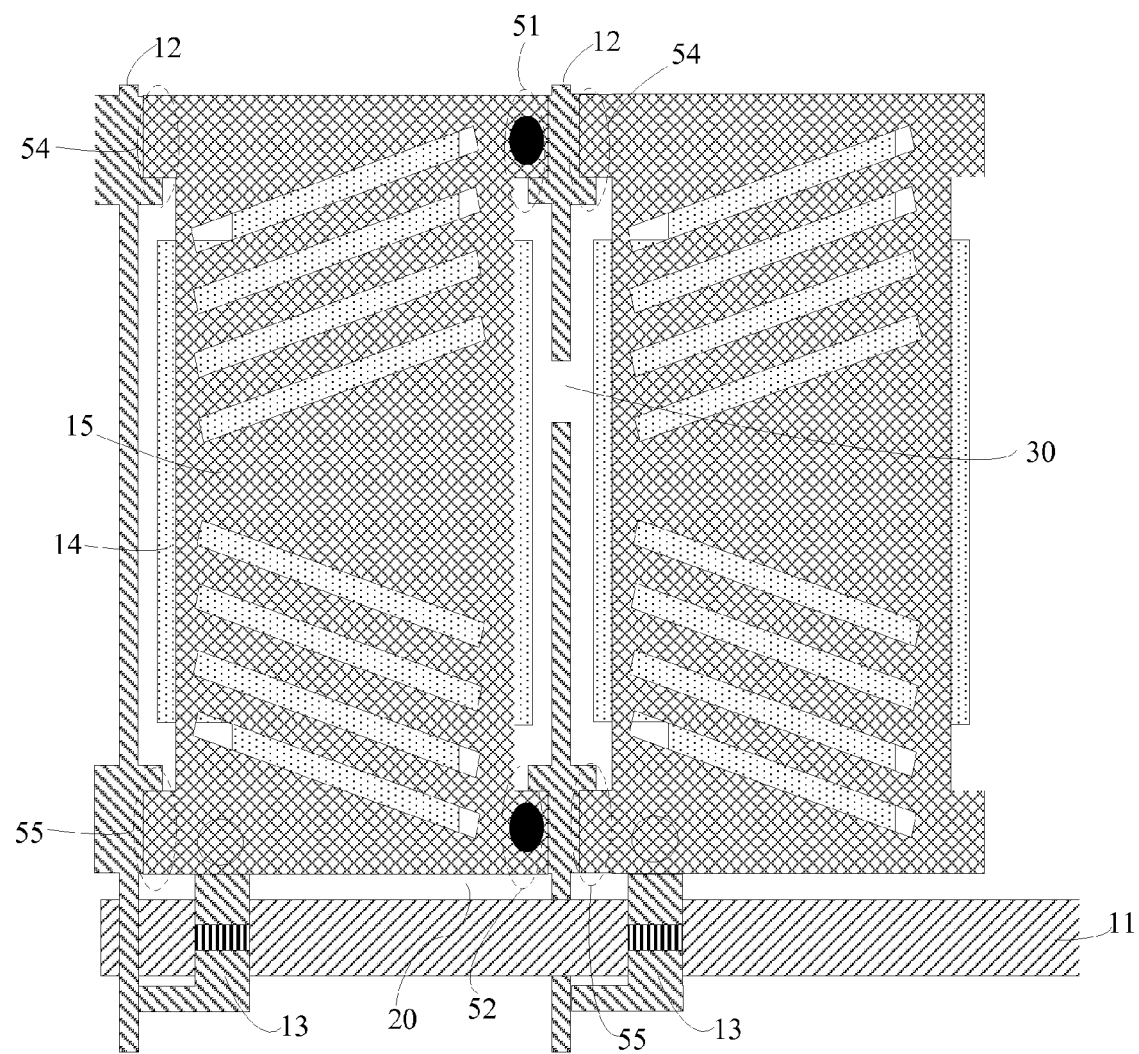
FIG. 8 is a schematic view showing a method for repairing a data-line broken line in an array substrate, which is formed with the pixel structure as shown in FIG. 7.

With reference to the array substrate shown in FIG. 7, there is provided a method for repairing its broken line for data lines 12 below with reference to FIG. 8, which comprises:

c1, the position of a breakpoint 30 of a data line is detected and determined;

c2, by means of laser soldering, the pixel electrode 15 in the first repair area 51 on one side of the breakpoint 30 of the data line is connected to the data line 12, and the pixel electrode 15 in the second repair area 52 on another side of the breakpoint of the data line 12 is connected to the data line 12.

Wherein, step c2 may alternatively be: by means of laser soldering, the pixel electrode 15 in the fourth repair area 54 on one side of the breakpoint of the data line 12 is connected to the data line 12, and the pixel electrode 15 in the fifth repair area 55 on another side of the breakpoint of the data line 12 is connected to the data line 12. Regarding this method for repairing the broken line for the data line 12, although positions for laser soldering during the reparation are not denoted in the figure, those skilled in the art can definitely find the positions for laser soldering from the above descriptions.

In both of the two methods of step c2, the data lines on two sides of the breakpoint 30 of the data line are connected through the pixel electrode, thereby repairing the broken line for data lines.

Figure 9:
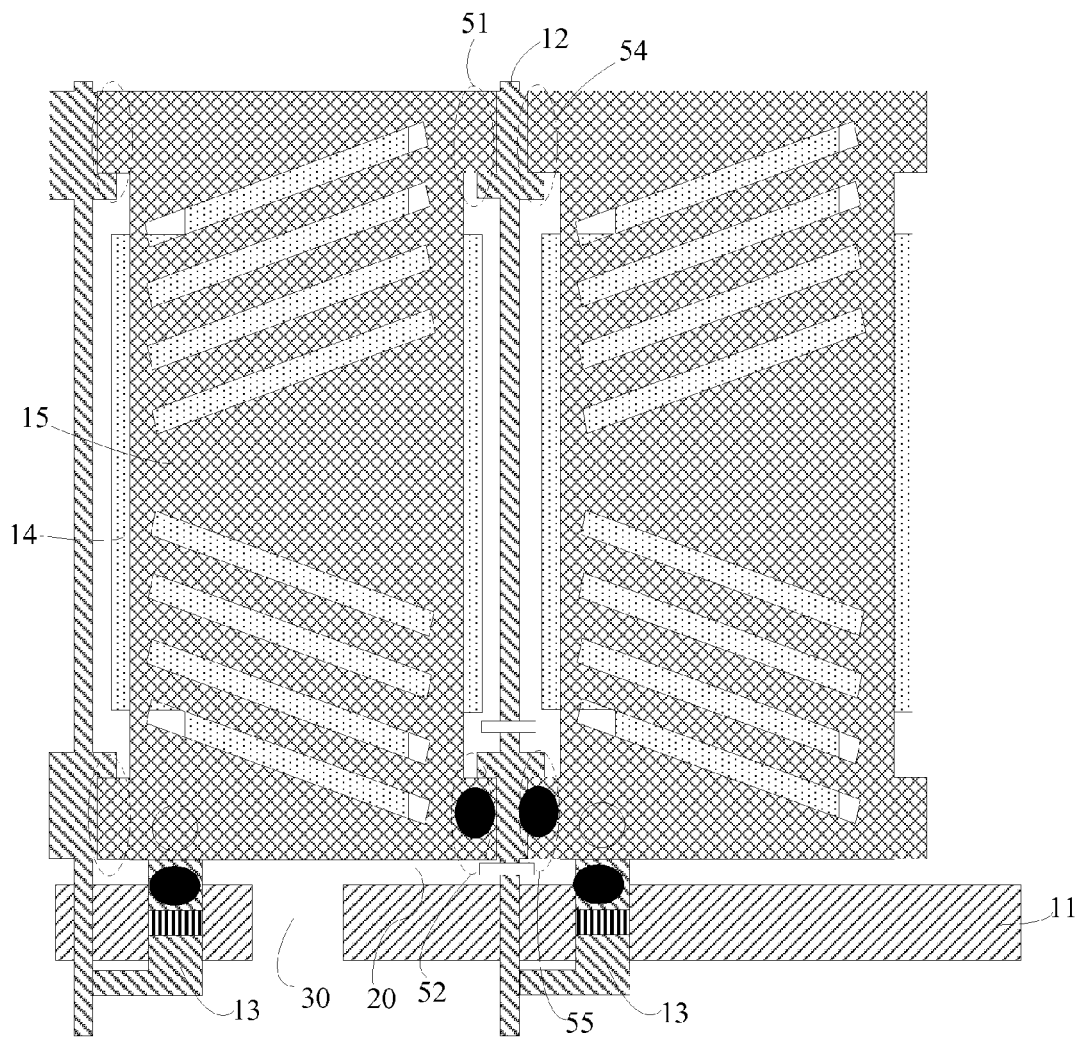
FIG. 9 is a schematic view showing a method for repairing a gate-line broken line in an array substrate, which is formed with the pixel structure as shown in FIG. 7.

With reference to the array substrate shown in FIG. 7, there is provided a method for repairing its broken line for gate lines 11 below with reference to FIG. 9, which comprises:

d1, the position of a breakpoint 30 of a gate line is detected and determined;

d2, by means of laser soldering, a drain of a thin film transistor 13 (the thin film transistor in a pixel unit on the left in FIG. 9) on one side of the breakpoint 30 of the gate line is connected to the gate line 11;

and by means of laser cutting, a data line 12 on another side of the breakpoint of the gate line 11 is cut off at two sides of two repair areas adjacent to the gate line 11. The cut-off positions refer to the positions denoted by blank rectangles in FIG. 9. For example, the two repair areas adjacent to the gate line 11 are the second repair area 52 and the fourth repair area 55, and the data line 12 is cut off at two sides of the two repair areas in this process.

By means of laser soldering, the pixel electrodes 15 in the two repair areas (the second repair area 52 and the fifth repair area 55 in FIG. 9) are connected to the data line 12, respectively, and a drain of a thin film transistor 13 (the thin film transistor in a pixel unit on the right in FIG. 9) is connected to the gate line 11;

By step d2, the gate lines on the two sides of the breakpoint 30 of the gate line are connected by using the pixel electrodes in two pixel units and a cut-off section of the data line between the two pixel units, and thus the broken line for gate lines can be repaired. However, because a breakpoint is produced on the data line due to cutting of the data line, a step d3 is also needed to repair the cut-off data line.

d3, by means of laser soldering, the data line 12 is connected to the data repair line 41.

Figure 1:
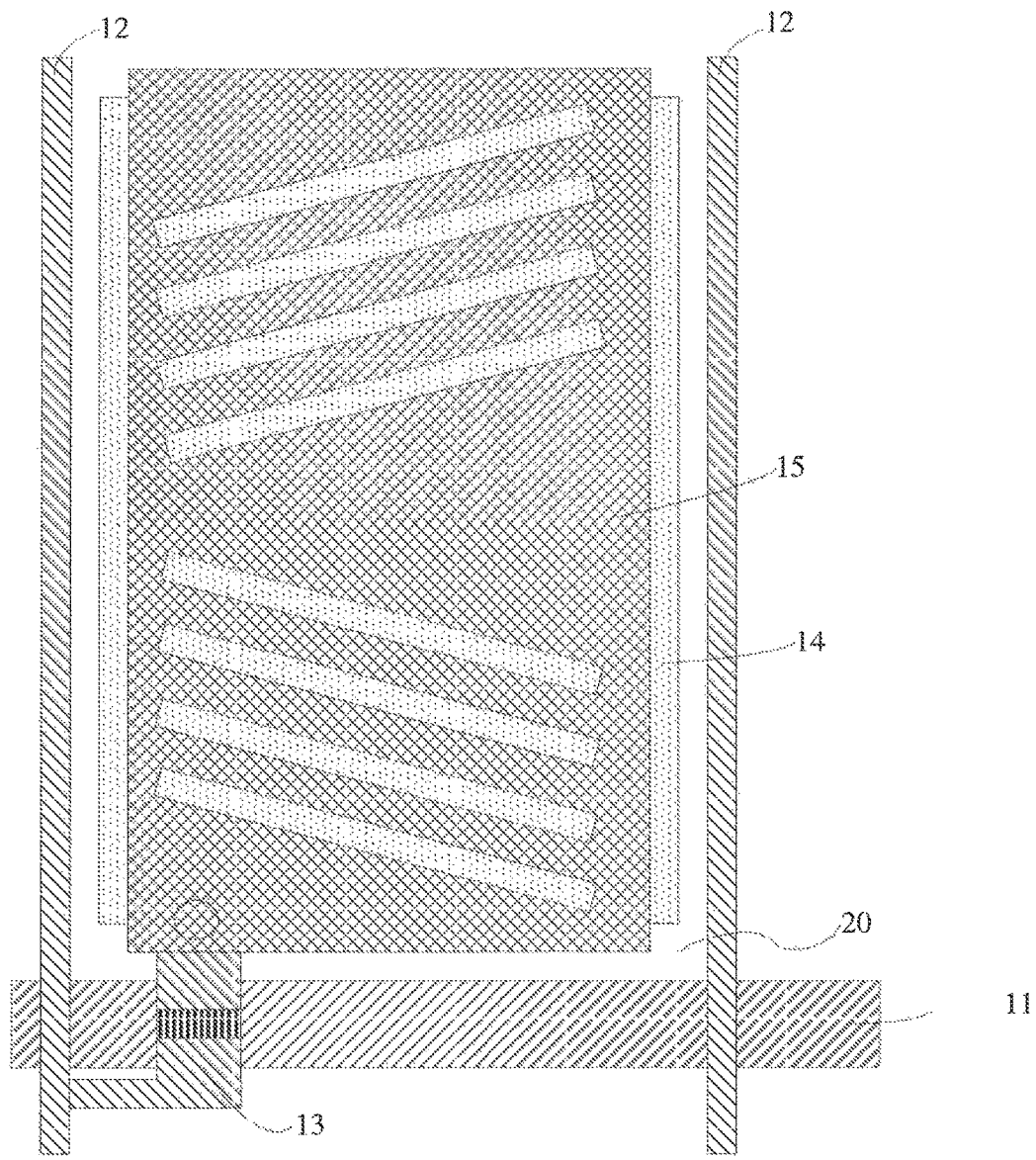
FIG. 1 is a schematic view showing a pixel structure on an array substrate of a liquid crystal display panel in the prior art.
Figure 2:
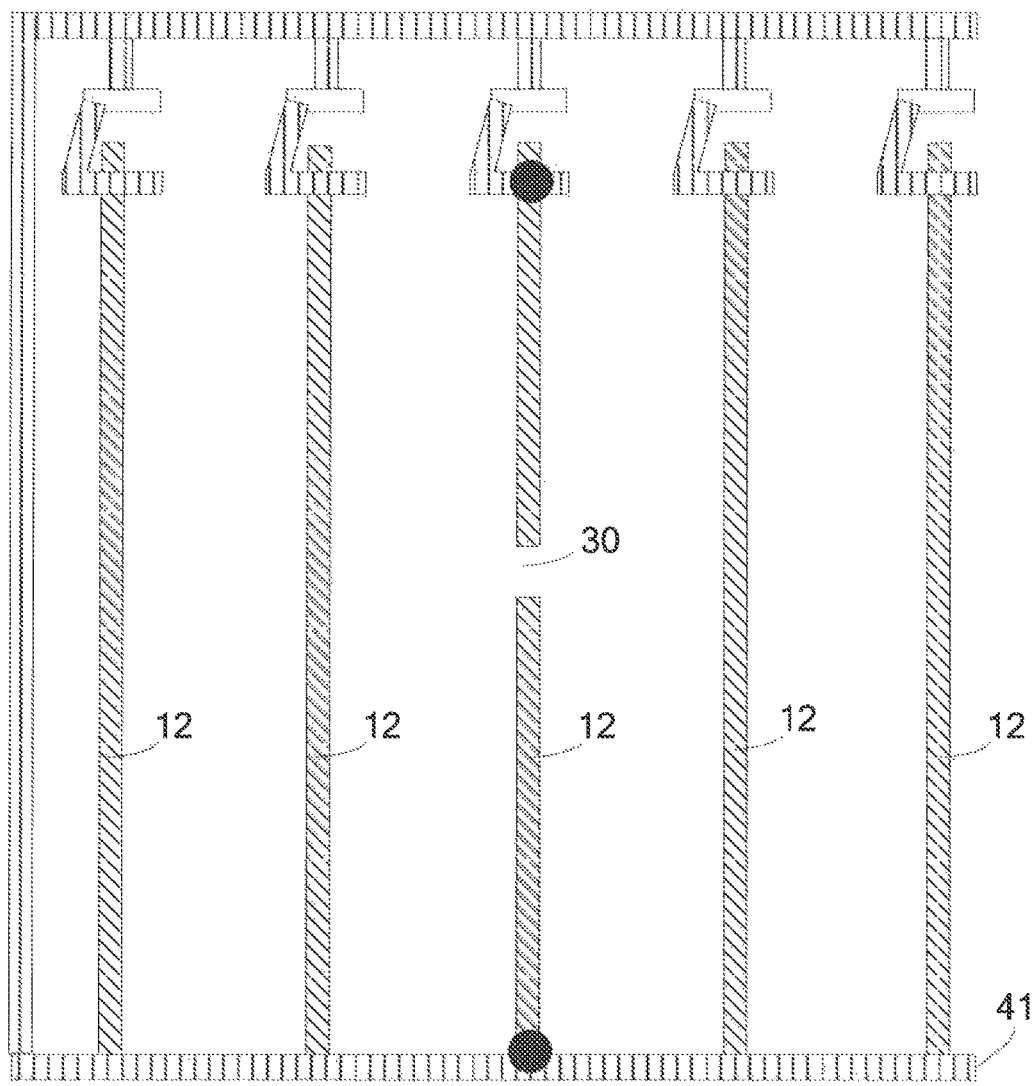
FIG. 2 is a schematic view showing a method for repairing a data-line broken line in the prior art.

The details may refer to FIG. 2, in which the two opposite ends of the cut-off data line 12 are connected, respectively, to the data repair line 41, so as to repair the cut-off data line.

It should be noted that, the step d2 and the step d3 are arranged in a random order; and individual processes in the step d2 are also arranged in a random order.

According to the technical solutions provided by the embodiment of the present disclosure, the first repair area and the second repair area (alternatively, the fourth repair area and the fifth repair area) can be used to repair a data-line broken line, and further, a gate-line broken line can be repaired in combination with the data repair line. The solutions provided by the present disclosure do not set a limit to the number of the data-line broken line, and even if the number of the data-line broken line or the gate-line broken line is larger, they may be repaired one by one, thereby increasing the yield of the liquid crystal display panel.

Further, according to the present invention, there is also provided a liquid crystal display panel, which includes a color filter substrate and an array substrate facing each other and a liquid crystal layer interposed therebetween. Any array substrate according to embodiments of the present disclosure may be used for the array substrate.

In addition, it should be noted that, overlapping the pixel electrode and the data line or the gate line in a repair area, as described herein, means that there is an overlapping portion in a plan view taken along a surface of the array substrate, but that does not mean that the pixel electrode can directly contact with the data line or the gate line. As can be appreciated by those skilled in the art, the pixel electrode, the data line and the gate line is usually formed in different layers, and an insulating layer (a gate insulating film or a passivation layer) is interposed between the different layers. Thus, before the repair area is soldered by laser, the pixel electrode within the repair area may not be electrically connected to the data line or the gate line.

In figures, only a shape that the pixel electrode is provided with slit-like openings is given as an example, however, the present disclosure is not limited to the foregoing specific forms. The present disclosure can be applied to various liquid crystal display panels and their array substrates, e.g. Twisted Nematic (TN) type panel, Vertical Alignment (VA) type panel, In-Plain Switch (IPS) type panel, and Fringe Field Switch (FFS) type panel.

The descriptions made above are merely the specific embodiments of the present disclosure, but the protection scope of the present disclosure is not limited thereto. Modifications or replacements, which are easily conceived by those skilled in the art within the technical scope disclosed by the present disclosure, should be embraced within the protection scope of the present disclosure. Therefore, the protection scope of the present disclosure should be defined by the protection scope of attached claims.

What is claimed is:

1. A method for repairing a broken line for the signal lines in an array substrate comprising:
signal lines, which includes a plurality of gate lines and a plurality of data lines intersecting with each other; and
a plurality of pixel units defined by the gate lines and the data lines,
wherein a thin film transistor, a common electrode and a pixel electrode, which is connected to a drain of the thin film transistor, are formed in each of the pixel units,
for each of the pixel units, at the positions of two corners which are adjacent to one of the data lines, a first repair area and a second repair area are formed, respectively; within the first repair area and the second repair area, patterns of the pixel electrode and the data line overlap, and there is no pattern of the common electrode,
wherein in the array substrate, a data repair line is formed around a pixel region comprising all of the pixel units;
for the pixel unit, at the positions of two corners which are adjacent to another data line, a fourth repair area and a fifth repair area are further formed; within the fourth repair area and the fifth repair area, patterns for the pixel electrode and the said another data line overlap, and there is no pattern of the common electrode; and
wherein, in each pixel unit, all of the first, second, fourth and fifth repair areas are included,
wherein the method comprises:
detecting and determining the position of a breakpoint for the gate lines;
by means of laser soldering, a drain of a thin film transistor on one side of the breakpoint of the gate line being connected to the gate line;
by means of laser cutting, a data line on another side of the breakpoint of the gate line being cut off at two sides of two repair areas adjacent to the gate line;
by means of laser soldering, pixel electrodes in the two repair areas being connected to the data line, respectively;
by means of laser soldering, a drain of a thin film transistor connected to the data line being connected to the gate line; and
by means of laser soldering, the data line being connected to the data repair line wherein the two repair areas adjacent to the gate line includes one second repair area and one fifth repair area in two adjacent pixel units, respectively.

2. The method claimed as claim 1, wherein two pads of the gate line at both sides of the breakpoint are connected to each other through drain electrodes of two thin film transistors and two pixel electrodes in two adjacent pixel units and one data line between the two adjacent pixel units.

* * * * *